United States Patent
Kase et al.

(10) Patent No.: US 6,709,959 B2
(45) Date of Patent: *Mar. 23, 2004

(54) SEMICONDUCTOR DEVICE HAVING A SHALLOW JUNCTION AND A FABRICATION PROCESS THEREOF

(75) Inventors: Masataka Kase, Kawasaki (JP); Toshiki Miyake, Kawasaki (JP); Mitsuaki Hori, Kawasaki (JP); Kenichi Hikazutani, Kawasaki (JP); Manabu Nakamura, Kawasaki (JP); Takayuki Wada, Kawasaki (JP); Yoshikazu Kataoka, Kasugai (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 58 days.

(21) Appl. No.: 09/472,829

(22) Filed: Dec. 28, 1999

(65) Prior Publication Data

US 2002/0177289 A1 Nov. 28, 2002

(30) Foreign Application Priority Data

Dec. 28, 1998 (JP) ............................. 10-374717

(51) Int. Cl.$^7$ .................. H01L 21/265; H01L 21/425; H01L 21/24
(52) U.S. Cl. ................ 438/530; 438/532; 438/533; 438/537
(58) Field of Search ............................. 438/530, 532, 438/533, 537

(56) References Cited

U.S. PATENT DOCUMENTS

| | | | | |
|---|---|---|---|---|
| 4,902,640 A | * | 2/1990 | Sachitano et al. | 437/57 |
| 5,192,714 A | * | 3/1993 | Suguro et al. | 437/195 |
| 5,539,203 A | * | 7/1996 | Ohdomari | 250/492.21 |
| 5,654,237 A | * | 8/1997 | Suguro et al. | 438/624 |

* cited by examiner

*Primary Examiner*—Long Pham
*Assistant Examiner*—Shrinivas H. Rao
(74) *Attorney, Agent, or Firm*—Westerman, Hattori, Daniels & Adrian, LLP (57) ABSTRACT

A semiconductor device is fabricated by introducing an impurity element into a Si substrate by an ion implantation process with an energy set such that the depth of a junction formed in the Si substrate by the impurity element is less than about 50 nm, and then annealing the substrate, wherein the method further includes a step of removing an oxide film from a surface of the Si substrate before the step of ion implantation process.

10 Claims, 6 Drawing Sheets

SEMICONDUCTOR DEVICE HAVING A SHALLOW JUNCTION AND A FABRICATION PROCESS THEREOF

CROSS-REFERENCE TO RELATED APPLICATIONS

This application is based upon and claims priority of Japanese Patent Application No.10-374717, filed on Dec. 28, 1998, the contents thereof being incorporated herein by reference.

BACKGROUND OF THE INVENTION

The present invention generally relates to semiconductor devices and more particularly to fabrication of a semiconductor device having a shallow junction.

In the art of CMOS LSIs (large scale integrated circuits), increase of integration density, and hence increase of operational speed of the semiconductor device, has been a consistent and important target of device development. Today, LSIs are fabricated according to the so-called submicron rules or sub-quarter micron rules and the minimum pattern width in the LSI is becoming smaller than 0.2 µm.

In the CMOS LSIs having such a very large integration density, it has been recognized that the so-called short-channel effect appears conspicuously. Such a short-channel effect emerges as a result of the MOS transistor operation deviating from the classical gradual approximation model. When such a deviation appears conspicuously, there arises various problems in the transistor operation such as decrease of drain current or shifting of threshold voltage.

Conventionally, it has been recognized that such a short channel effect can be reduced by decreasing the ion implantation energy or acceleration energy in the step of forming the source or drain region such that the depth of the junction formed in the semiconductor substrate is reduced.

TABLE I summarizes the acceleration energy and dose that have been used or to be used in the ion implantation process of CMOS technology of various generations in the past or in the future.

TABLE I

| device generation | 180 nm | 130 nm | 100 nm |
|---|---|---|---|
| contact hole size (nm) | 70–140 | 26–52 | 40–80 |
| channel length (nm) | 36–72 | 26–52 | 20–40 |
| drain extension (cm$^{-3}$) | $1 \times 10^{19}$ | $1 \times 10^{19}$ | $1 \times 10^{20}$ |
| p-drain i-i | B,2 keV | B,1 keV | B,0.5 keV |
| dose (cm$^{-2}$) | $8 \times 10^{13}$ | $8 \times 10^{13}$ | $8 \times 10^{13}$ |
| n-drain i-i | P,5 keV | Sb,10 keV | Sb,7 keV |
| dose (cm$^{-2}$) | $3 \times 10^{13}$ | $1 \times 10^{14}$ | $1 \times 10^{14}$ |

Referring to TABLE I, it should be noted that the acceleration energy is reduced with the progress of the device generation and hence device miniaturization, wherein it can be seen that the use of such a reduced ion implantation energy is particularly important in the formation of the p-type drain extension structures, which are formed by injection of B into the Si substrate by an ion implantation process. In the fabrication technology of a CMOS device of the 180 nm design rule, it should be noted that an acceleration energy of about 2 keV is used for the formation of the p-type drain extension structure, while in the case of a CMOS device fabricated according to the 130 nm design rule, an acceleration energy of about 0.5 keV may be used.

Conventionally, an ion implantation process has been conducted such that impurity ions are implanted into a Si substrate through a thin oxide film formed on the surface of the Si substrate. By employing such an approach, the impurity elements that have failed to enter the substrate and remaining on the surface of the oxide film in the form of precipitates are removed easily by conducting a cleaning process or by removing the oxide film itself, and the reliability of the semiconductor device is improved.

On the other hand, such an approach to implant the impurity ions into the substrate through such an oxide film causes a problem, particularly in the advanced high-speed CMOS devices having a very shallow LDD (lightly doped drain) structure, in that it is necessary to use a relatively large energy for causing the impurity ions to reach the Si substrate after traversing through the oxide film. Because the use of large acceleration energy induces a large standard deviation in the particle energy, it should be noted that the depth of the junction formed in the Si substrate tends to become deep. This problem becomes particularly acute in the formation of the p-type diffusion region which is formed by an ion implantation of B.

Figure 1:
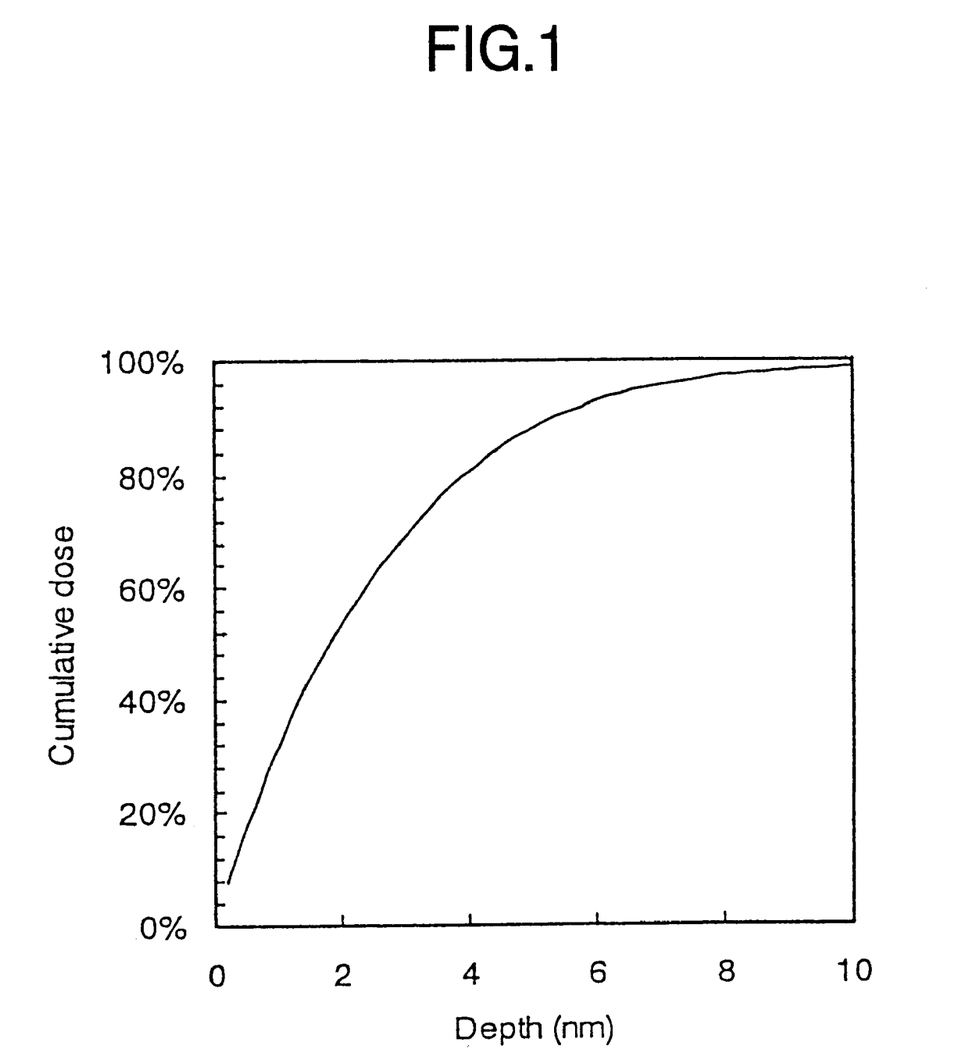
FIG. 1 is a diagram showing the accumulated concentration of B introduced in a Si substrate by a low energy ion implantation process.

FIG. 1 shows the accumulated dose of B for the case in which B is implanted to a Si substrate in the form of B$^+$ with an acceleration energy of 0.5 keV. It should be noted that the accumulated dose of FIG. 1 represents the ratio of the B atoms included in the Si substrate in the region between the substrate surface and the designated depth over the entire amount of the B atoms implanted in the Si substrate. Thus, the accumulated dose is calculated from the depth profile of B in the Si substrate obtained by an SIMS (secondary ion mass spectroscopy) analysis. In view of the fact that the depth profile of B in an SiO$_2$ film and the depth profile of B in an Si substrate are more or less the same, the accumulation dose of FIG. 1 can be regarded as the proportion of the B atoms captured by an SiO$_2$ film covering the Si substrate with a desired thickness.

In the process technology of the state of the art, an SiO$_2$ film can be formed on a Si substrate with reliability only when the thickness thereof is more than about 2 nm. Assuming that the thickness of the SiO$_2$ film is 2 nm, FIG. 1 indicates that about 50% of the B atoms are captured by the SiO$_2$ film. In other words, the efficiency of B injection into the Si substrate becomes substantially poor in the process technology available today, provided that the ion implantation process is conducted through a thermal oxide film. When the efficiency of injection of the impurity element into the Si substrate is low as such, the impurity concentration level in the Si substrate cannot be increased as desired, and the diffusion region tends to show an increased resistance. Because of this, the process technology of forming a thin oxide film on a Si substrate with a thickness of less than 2 nm is now becoming a key technology in the fabrication process of extremely miniaturized, high-speed semiconductor devices characterized by a very shallow junction.

Conventionally, it has been realized that the processing of a Si substrate surface by an oxidizing agent to form a chemical oxide film is effective for forming such a desirable, very thin oxide film. For example, it is possible to form a chemical oxide film with a thickness of about 1.2 nm by treating the surface of the Si substrate by a nitric acid.

It should be noted that the wet treatment process used for forming such a chemical oxide film is generally conducted by a solution containing hydrogen peroxide. For this purpose, various chemical agents listed below in TABLE II are known, including HPM (hydrochloric peroxide mixture), SPM (sulfuric acid peroxide mixture), and APM (ammoniac peroxide mixture).

TABLE II

| | | |
|---|---|---|
| HPM | $HCL:H_2O_2:H_2O$ = 1:1:5 – 1:2:7 | 75–85° C. |
| SPM | $H_2SO_4:H_2O_2$ = 4:1 | high temperature |
| APM | $NH_4OH:H_2O_2:H_2O$ = 1:1:6 – 1:2:8 | 75–85° C. |

Thus, it has been thought that the desired low energy ion implantation of the impurity element may become possible by forming such a thin chemical oxide film on the surface of the Si substrate and by conducting the ion implantation process through the thin chemical oxide film.

In the experimental investigation that constitutes the foundation of the present invention, however, the inventor of the present invention has discovered unexpectedly that the diffusion of the B atoms is substantially facilitated in the Si substrate when the B atoms are introduced into the Si substrate by a low-energy ion implantation process conducted through such a thin chemical oxide film. As a result of the facilitated diffusion, the B atoms penetrates deeply into the Si substrate. Although the exact mechanism of phenomenon is not well understood at the moment, it is plausible that the point defects associated with the Si—O dangling bonds on the surface of the chemical oxide film are injected into the Si substrate at the ion implantation process together with the impurity element.

Thus, in the case the impurity ion implantation is conducted in the state that the surface of the Si substrate is covered by a thin chemical oxide film, the injected impurity ions penetrate deeply into the substrate even in the case the ion implantation process is conducted under a low acceleration energy. Thereby, the junction defining the bottom edge of the diffusion region is located at a substantial depth in the substrate and the semiconductor device thus formed becomes vulnerable to short channel effect.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a fabrication process of a semiconductor device including an ion implantation step conducted under a low acceleration energy, wherein the diffusion of the impurity element thus introduced into a semiconductor substrate is effectively suppressed.

Another object of the present invention is to provide a semiconductor device having a shallow junction.

Another object of the present invention is to provide method of fabricating a semiconductor device, comprising the steps of:
 introducing an impurity element into a Si substrate by an ion implantation process with an energy set such that the depth of a junction formed in said Si substrate by said impurity element is less than about 40 nm; and
 annealing, after said step of ion implantation process, said substrate;
 wherein said method further includes a step of removing an oxide film from a surface of said Si substrate before said step of ion implantation process.

Another object of the present invention is to provide a method of fabricating a semiconductor device, comprising the steps of:
 forming a chemical oxide film on a surface of a Si substrate;
 reducing the number of Si—O dangling bonds existing on a surface of said chemical oxide film;
 introducing an impurity element into said Si substrate through said chemical oxide film under an acceleration energy lower than about 0.5 keV; and
 annealing said Si substrate thus introduced with said impurity element.

Another object of the present invention is to provide a method of fabricating a semiconductor device, comprising the steps of:
 forming a device isolation region on a surface of a semiconductor substrate;
 forming a gate oxide film on a surface of said semiconductor substrate;
 depositing a gate electrode layer on said gate oxide film;
 patterning said gate electrode layer to form a gate electrode; and
 introducing an impurity element into said semiconductor substrate by an ion implantation process conducted under an acceleration energy lower than about 0.5 keV or lower;
 wherein said method further includes a step of removing said gate oxide film from said surface of said semiconductor substrate immediately before said step of ion implantation.

Another object of the present invention is to provide a method of fabricating a semiconductor device, comprising the steps of:
 forming a device isolation region on a surface of a semiconductor substrate;
 forming a chemical oxide film on a surface of said semiconductor substrate as a gate oxide film;
 depositing a gate electrode layer on said gate oxide film;
 patterning said gate electrode layer to form a gate electrode; and
 introducing an impurity element into said semiconductor substrate by an ion implantation process conducted under an acceleration energy of about 0.5 keV or lower;
 wherein said method further includes a step of reducing the number of dangling bonds from a surface of said gate oxide film before said step of ion implantation process of said impurity element but after said step of patterning said gate electrode.

According to the present invention, injection of point defects into the Si substrate is effectively eliminated at the time of the low energy ion implantation process by conducting the ion implantation process in the state that the oxide film is removed from the Si substrate surface or in the state that the Si—O dangling bonds are eliminated from the surface of the chemical oxide film provided on the Si substrate surface. Thereby, the problem of increase of the diffusion coefficient of the impurity element associated with the point defects in the Si substrate is effectively eliminated.

Other objects and further features of the present invention will become apparent from the following detailed description when read in conjunction with the attached drawings.

DETAILED DESCRIPTION OF THE PREFERRED EMBODIMENT

[PRINCIPLE]

Figure 2:
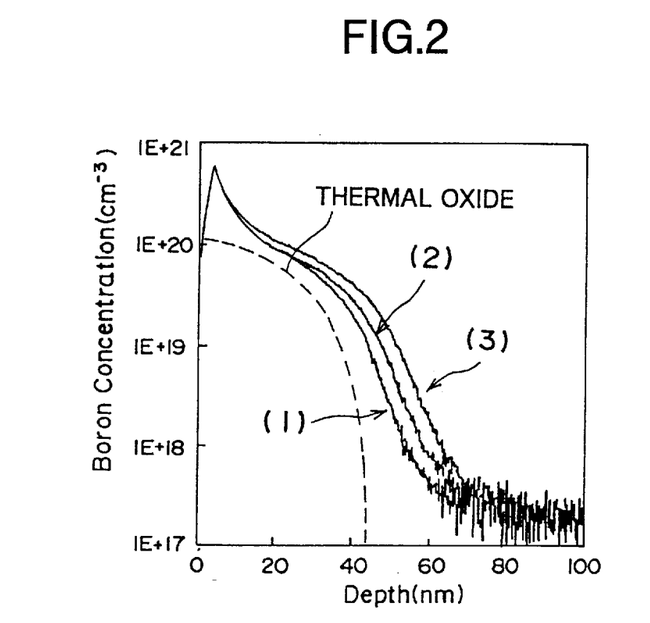
FIG. 2 is a diagram showing the depth profile of B introduced in a Si substrate by a low energy ion implantation process.
Figure 3:
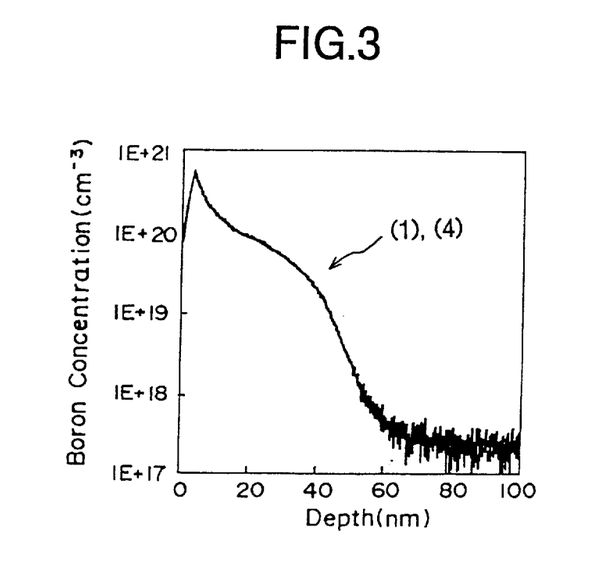
FIG. 3 is another diagram showing the depth profile of B introduced in a Si substrate by a low energy ion implantation process.

FIGS. 2 and 3 show the depth profile of B in a Si substrate obtained by an SIMS analysis for the case in which $B^+$ ions are introduced into the Si substrate under a low acceleration voltage of 0.5 keV and a dose of $2 \times 10^{15}$ cm$^{-2}$, wherein FIGS. 2 and 3 show state in which that the Si substrate is subjected to a rapid, spike thermal annealing process conducted at 1050° C. after the ion implantation process. In the foregoing spike thermal annealing process, the substrate is heated rapidly to the temperature of 1050° C., wherein the temperature of 1050° C. is maintained for the duration of substantially zero seconds. In FIGS. 2 and 3, it should be noted that the depth is measured from the surface of the Si substrate.

Referring to FIG. 2 showing curves (1)–(3), the curve designated by a curve (1) represents the sample in which the surface of the Si substrate is processed by a diluted hydrofluoric acid (HF) prior to the ion implantation process, while the curve designated by a curve (2) represents the sample in which the Si substrate surface is processed by the HPM solution (TABLE II) prior to the ion implantation process. Further, the curve designated by a curve (3) represents the sample in which the Si substrate surface is processed by a nitric acid (HNO$_3$) prior to the ion implantation process. Thus, the Si substrate is covered by a thin chemical oxide film in the sample (2) and the sample (3) and the ion implantation of $B^+$ is conducted through the thin chemical oxide film in both cases. In the case of the sample (1), on the other hand, the ion implantation process of $B^+$ is conducted into the fresh surface of the Si substrate exposed by the HF treatment.

On the other hand, FIG. 3 shows the sample designated by the curve (4), wherein the sample (4) represents the case in which the sample (2) of FIG. 2 is subjected to an annealing process at 700° C. in an N$_2$ atmosphere prior to the ion implantation process. For the sake of comparison, FIG. 3 also shows the curve (1) in addition to the curve (4).

TABLE III below summarizes the preparatory processes applied to the samples (1)–(4) before the ion implantation process in more detail.

TABLE III

| sample # | NH$_4$OH/H$_2$O$_2$ | chemical oxide formation | N$_2$ anneal 700° C. 30 min |
|---|---|---|---|
| (1) | yes | no (HF) | no |
| (2) | yes | yes (HPM) | no |
| (3) | yes | yes (HNO$_3$) | no |
| (4) | yes | yes (HPM) | yes |

In the case a Si wafer having a (100)-oriented surface and a resistivity of 10 Ωcm is used for the Si substrate, it was observed that the sample (1) is substantially free from oxide film. Optical interferometry applied to the sample (1) indicated that the thickness of the oxide film, if present, should be smaller than 1.7Å. In the case of the sample (2), on the other hand, it was observed that there is formed a chemical oxide film on the surface of the Si substrate with a thickness of 4 Å. Further, in the case of the sample (3), the existence of a chemical oxide film was also confirmed on the Si substrate with a thickness of 12Å. In the case of the sample (4), in which the N$_2$ annealing process is applied to the sample (2), the thickness of the chemical oxide film was 11Å.

After the removal of the oxide film, or after formation of the chemical oxide film according to the condition set forth in TABLE III, the Si substrate was subjected to an ion implantation process of $B^+$ under an acceleration voltage of 0.5 keV and a dose of $2 \times 10^{15}$ cm$^{-2}$. After the ion implantation process, a cleaning process is applied further to the substrate, wherein the cleaning process includes a cleaning process conducted by a solution of NH$_4$OH and H$_2$O$_2$, followed by an HPM process. Further, the substrate thus processed was subjected to a spike annealing process at 1050° C. It should be noted that the results of FIGS. 2 and 3 are obtained for the samples thus prepared.

Referring to FIG. 2, it should be noted that the depth of penetration of B into the Si substrate is smaller in the sample (1) as compared with the sample (2) or sample (3). In other words, the result of FIG. 2 indicates that the depth of penetration of the B in the Si substrate increases in the case the Si substrate surface is covered by a chemical oxide film and the ion implantation process is conducted in this state, as compared with the case (1) in which oxide film is removed from the Si substrate surface. Thus, the result of FIG. 2 indicates that, in the case the diffusion regions of a MOS transistor are formed in the Si substrate by a low energy ion implantation process conducted through a thin chemical oxide film, the carriers penetrate deeply into the substrate and the MOS transistor tends to show a conspicuous short-channel effect particularly in the case the gate length of the MOS transistor is short.

FIG. 2 also shows the B profile for the case corresponding to FIG. 1, in which the substrate surface is covered by a thermal oxide film. In this case, while the distribution profile itself is controlled satisfactorily, the majority of the $B^+$ ions are intercepted by the thermal oxide film and the concentration level of B in the Si substrate is reduced inevitably. In order to achieve a realistic concentration level in the diffusion region, it is necessary to use a large acceleration voltage, while the use of large acceleration voltage increases the depth of penetration of B into the substrate.

In FIG. 2, it should be noted that the concentration level of B in the Si substrate is slightly lower in the sample (1) or sample (2) as compared with the sample (3) at the depth of about 20 nm, which depth being important for the diffusion region of a MOS transistor. On the other hand, it should be noted that the B peak at the depth of about 5 nm influences little to the device operation, as the B ions at this depth do not undergo substantial activation due to the excessively high concentration level of B. Thereby, the transistor performance is influenced little by the existence of the B concentration peak. In FIG. 3, on the other hand, it will be noted that the sample (4), in which the chemical oxide film of the sample (2) is subjected to the thermal annealing process in the N$_2$ atmosphere, provides a B profile substantially identical with the B profile of the sample (1). Although the reason or exact mechanism of this phenomenon is not understood yet as noted before, it is thought plausible that the thermal annealing process applied to the chemical oxide film eliminates the dangling bonds from the surface of the chemical oxide film, and the point defects associated with the Si—O dangling bonds are no longer injected into the Si substrate even when the ion implantation process of B is conducted into the Si substrate. Because of the reduced concentration level of the point defects in the Si substrate, the diffusion coefficient of B is also reduced in the Si substrate.

AS noted in FIGS. 2 and 3, the B concentration level in the Si substrate increases in any of the cases (1)–(4) over the case in which the Si substrate is covered by a thermal oxide film.

Further, TABLE IV below represents the sheet resistance of the Si substrate obtained by a four point probe method.

TABLE IV

| sample | sheet resistance (Ω/_) |
|---|---|
| 1 | 262.8 |
| 2 | 261.2 |
| 3 | 252.2 |
| 4 | 279.6 |

Referring to TABLE IV, it can be seen that the samples (1) and (2) have substantially the same sheet resistance while the sample (3) shows a reduced sheet resistance due to the increased penetration depth of B into the substrate. On the other hand, the sample (4) shows a slightly increased sheet resistance due to the large thickness of the oxide film covering the substrate surface. It is believed that the increased thickness of the oxide film prevents the penetration of the injected B ions into the Si substrate and this is the cause of the foregoing increase of the sheet resistance.

FIRST EMBODIMENT

Figure 4:
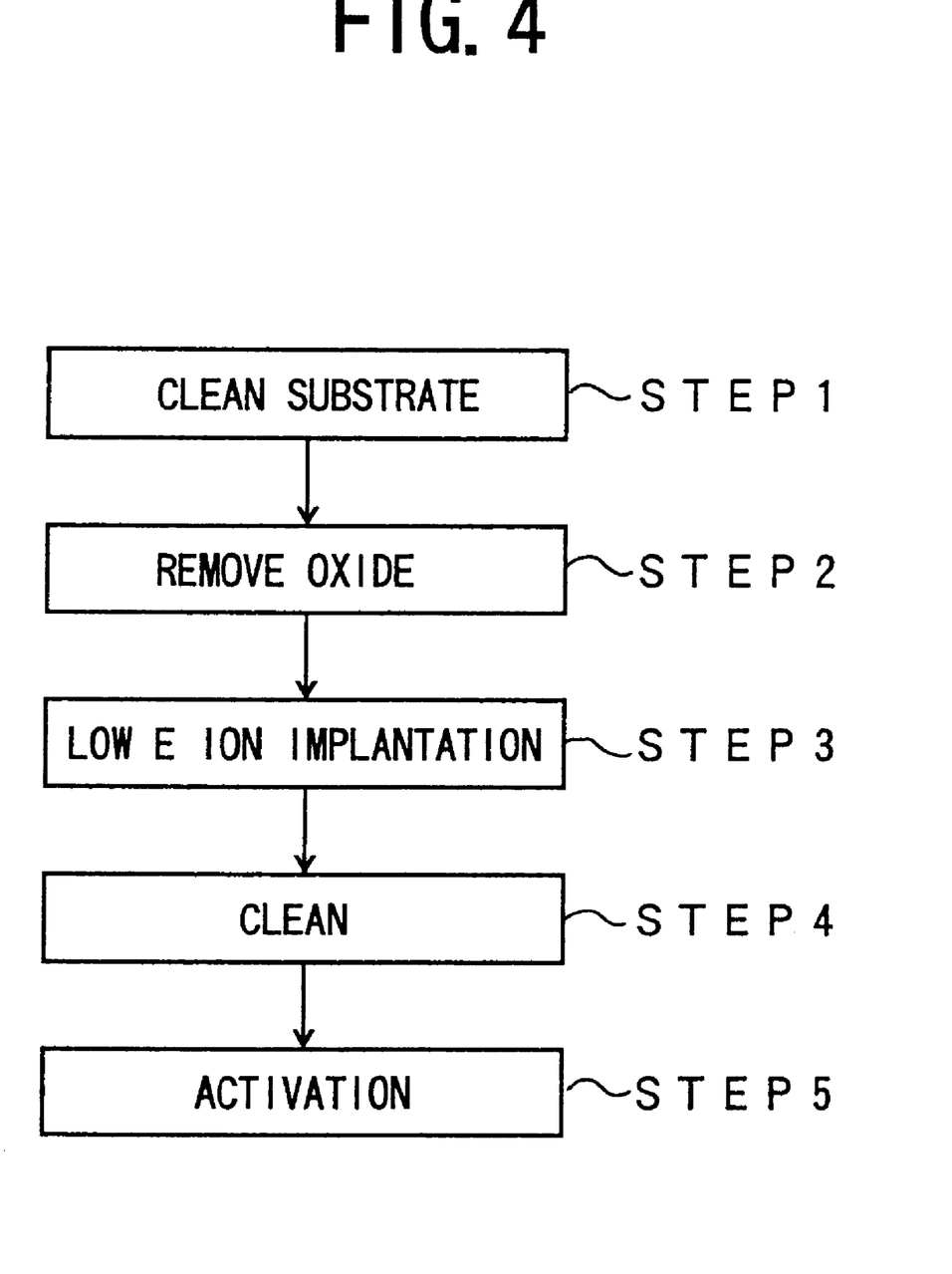
FIG. 4 is a flowchart showing the process of forming a shallow diffusion region by a low energy ion implantation process according to a first embodiment of the present invention.

FIG. 4 shows the process of forming a B diffusion region in a Si substrate by a low energy ion implantation process according to a first embodiment of the present invention. In the present embodiment, the penetration depth of B in the Si substrate is reduced by avoiding the formation of chemical oxide on the surface of a Si substrate.

Referring to FIG. 4, the process starts with a step S1 in which a Si substrate is dipped in a bath of $NH_4OH$ and $H_2O_2$ and the contaminants are removed from the surface of the Si substrate.

Next, in the step 2, the Si substrate is dipped in a bath of HF and the native oxide film or any oxide film covering the surface of the Si substrate is removed. As a result of the step 2, a fresh surface of the Si substrate is exposed. After the step 2, various processes other than ion implantation process, oxide film formation or chemical oxide film formation may be conducted.

Next, in the step 3, $B^+$ is introduced into the Si substrate under an acceleration energy of typically 0.2–1.5 keV, preferably about 0.5 keV with a desired dose such as $2 \times 10^{15} cm^{-2}$, and the B contaminants formed on the surface of the substrate are removed in the step 4 by conducting an SC-1 cleaning process that uses APM as explained previously.

In the ion implantation process of the present embodiment, it should be noted that the source of B is not limited to $B^+$, but various other B- containing species such as $BF_2^+$ or a borane compound $B_xH_y$, for example decaborane $B_{10}H_{14}$, may also be used. In the case of using $BF_2^+$, an acceleration energy of 2.5 keV may be used as an equivalent acceleration energy of 0.5 keV for $B^+$.

Next, in the step 5, a rapid thermal annealing process is conducted to the temperature of 1050° C., so that the B ions thus introduced are activated.

In the present embodiment, it should be noted that the depth profile of B in the Si substrate is controlled effectively by eliminating the process of forming a chemical oxide film on the surface of the Si substrate. One approach of this is to eliminate the oxide film from the Si substrate as represented in the step 2 of FIG. 4.

By conducting the process of FIG. 4, a depth profile of B similar to the one for the sample (1) of FIG. 2 is obtained. As noted in FIG. 2, the curve (1) provides a B concentration level of $1 \times 10^{18} cm^{-3}$ at the depth of about 50 nm, more exactly at about 52–53 nm, while the curve (1) also provides a B concentration level of about $1 \times 10^{20} cm^{-3}$ at the depth of about 20 nm.

SECOND EMBODIMENT

Figure 5:
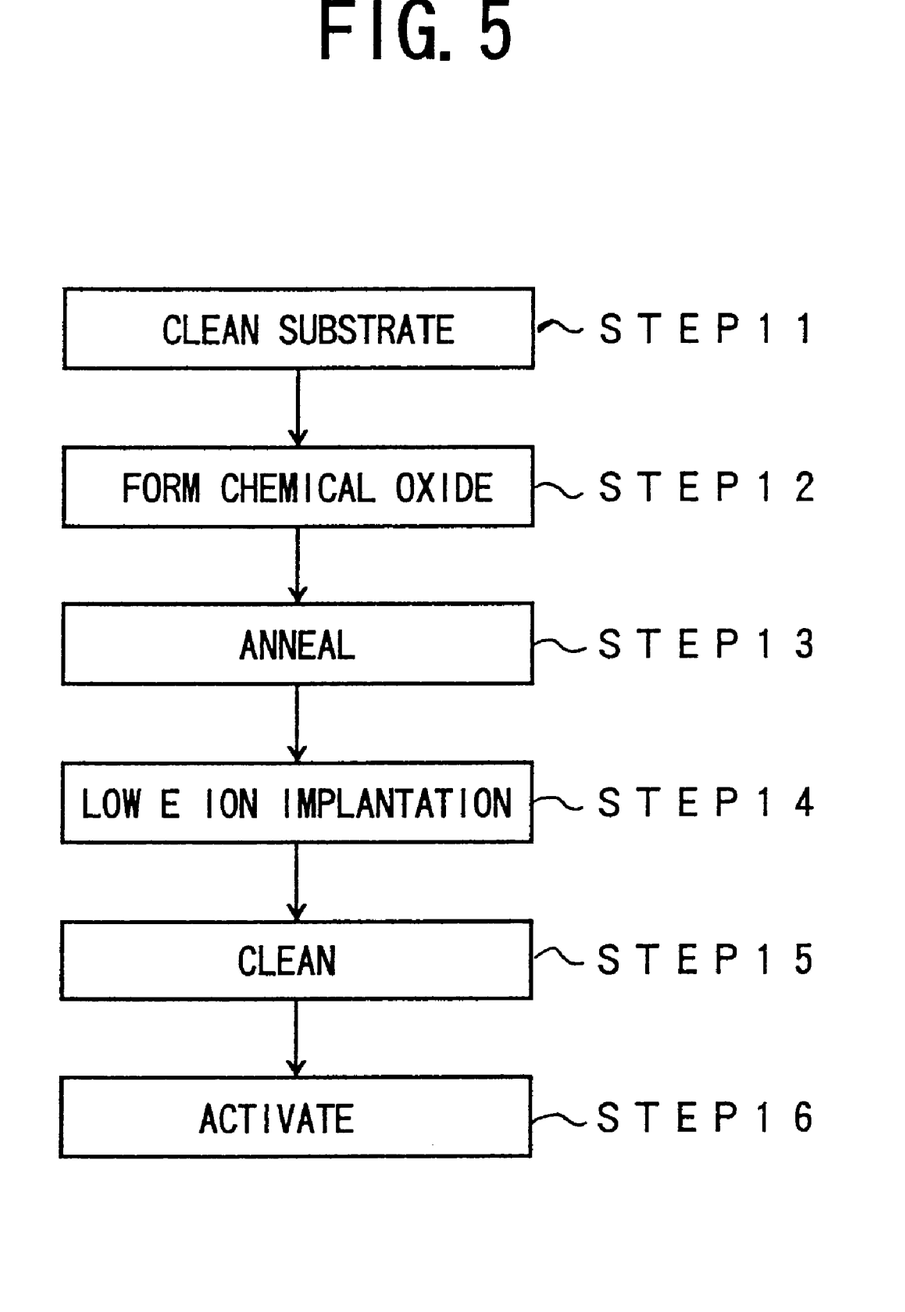
FIG. 5 is a flowchart showing the process of forming a shallow diffusion region by a low energy ion implantation process according to a second embodiment of the present invention.

FIG. 5 shows the process of forming a B diffusion region in a Si substrate by a low energy ion implantation process according to a second embodiment. In the present embodiment, a chemical oxide film is formed on the surface of Si substrate and the low-energy ion implantation process is conducted through such a chemical oxide film.

Referring to FIG. 5, a step 11 is conducted in which a Si substrate is cleaned in a bath of $NH_4OH$ and $H_2O_2$ so that contaminants are removed from the surface thereof.

Next, in the step 12 of FIG. 5, the Si substrate is dipped into a solution containing $H_2O_2$ and a chemical oxide film is formed on the surface of the Si substrate with a thickness of typically about several Ångstroms. The step 12 may be conducted by using HPM, SPM or APM explained previously with reference to TABLE II for the solution. Alternatively, a solution containing ozone ($O_3$) may also be used for forming the chemical oxide film.

Next, in the step 13 of FIG. 5, the Si substrate thus formed with the chemical oxide film is subjected to an annealing process conducted in an inert atmosphere, typically a $N_2$ or Ar atmosphere, at a temperature of about 700° C. As a result of the thermal annealing process, S—O dangling bonds are eliminated from the surface of the chemical oxide film formed in the step 12.

Next, in the step 14 of FIG. 5, an ion implantation process of $B^+$ is conducted in the step 14 into the Si substrate under an acceleration energy of 0.2–1.5 keV, preferably at about 0.5 keV, with a dose of $2 \times 10^{15} cm^{-2}$, for example.

After the step 14, the substrate is subjected to an SC-2 cleaning process in the step 15 so as to remove the B contaminants deposited on the surface of the chemical oxide film by dissolving the B contaminants into an SC-1 cleaning solution of $NH_4OH$ and $H_2O_2$, and the substrate thus cleaned is subjected to a spike annealing process in the step 16 conducted at 1050° C. for substantially zero seconds. As a result of the spike annealing process of the step 16, the B ions introduced in the step of FIG. 14 are activated and there is formed a desired p-type shallow diffusion region in the Si substrate.

In the present embodiment, it should be noted that the injection of the point defects associated with the Si—O dangling bonds on the surface of the chemical oxide film into the Si substrate is effectively eliminated by eliminating the Si—O dangling bonds from the surface of the chemical oxide film by applying a thermal annealing process in an inert atmosphere prior to the ion implantation process. Thereby, the problem of increase of the diffusion coefficient of B in the Si substrate is successfully suppressed.

In the present embodiment, too, it is possible to use $BF_2^+$ or a borane compound $B_xH_y$ such as $B_{10}H_{14}$ may also be used for the source of B.

By conducting the process of FIG. 5, a depth profile of B similar to the one for the sample (4) of FIG. 2 is obtained, wherein the curve of the sample (4) is substantially identical with the curve for the sample (1) as noted previously.

THIRD EMBODIMENT

FIGS. 6A–6E show the fabrication process of a semiconductor device 10 according to a third embodiment of the present invention.

Figures 6A, 6B:
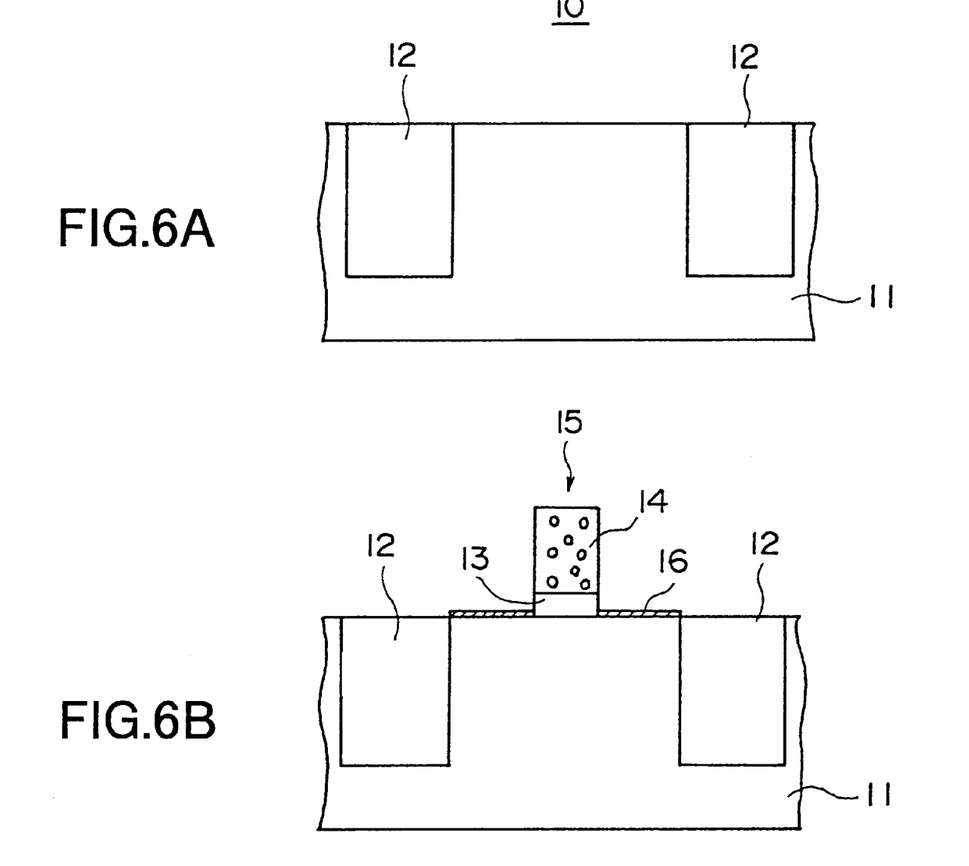
FIGS. 6A–6E are diagrams showing the fabrication process of a semiconductor device according to a third embodiment of the present invention.

Referring to FIG. 6A, a shallow trench isolation (STI) structure 12 is formed on a p-type Si substrate 11 according to a well known process, and an n-type well (not shown) is formed in the Si substrate 12 by a photolithographic process and an ion implantation process of an n-type impurity element such as P or As.

Next, in the step of FIG. 6B, a gate insulation film 13 is formed on the Si substrate 11 as a result of a thermal oxidation process of the Si substrate 11, and a polysilicon layer 14 is deposited on the gate insulation film 13. Further, the polysilicon layer 14 and the underlying gate insulation film 13 are patterned by a photolithographic process to form a gate structure 15 on the Si substrate 11.

In the photolithographic process of FIG. 6B, it should be noted that the surface of the Si substrate 11 exposed as a result of the patterning of the gate structure 15 is covered by a native oxide film 16.

Figure 6C:
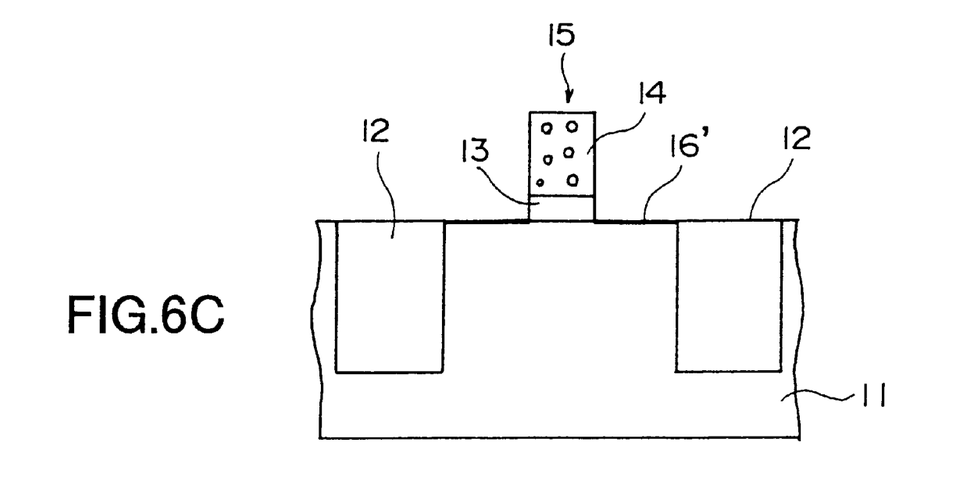

Next, in the step of FIG. 6C, the Si substrate 11 is dipped into a diluted HF solution so as to remove the native oxide film 16, and as a result, a fresh surface of the Si substrate 11 is exposed in the regions 16' at both lateral sides of the gate structure 15.

In the step of FIG. 6C, an ion implantation process of $B^+$ is further conducted into the Si substrate 11 in the state as represented, wherein the ion implantation process is conducted under an acceleration voltage of 0.5 keV with a dose of $2\times10^{15}cm^{-2}$.

Figure 6D:
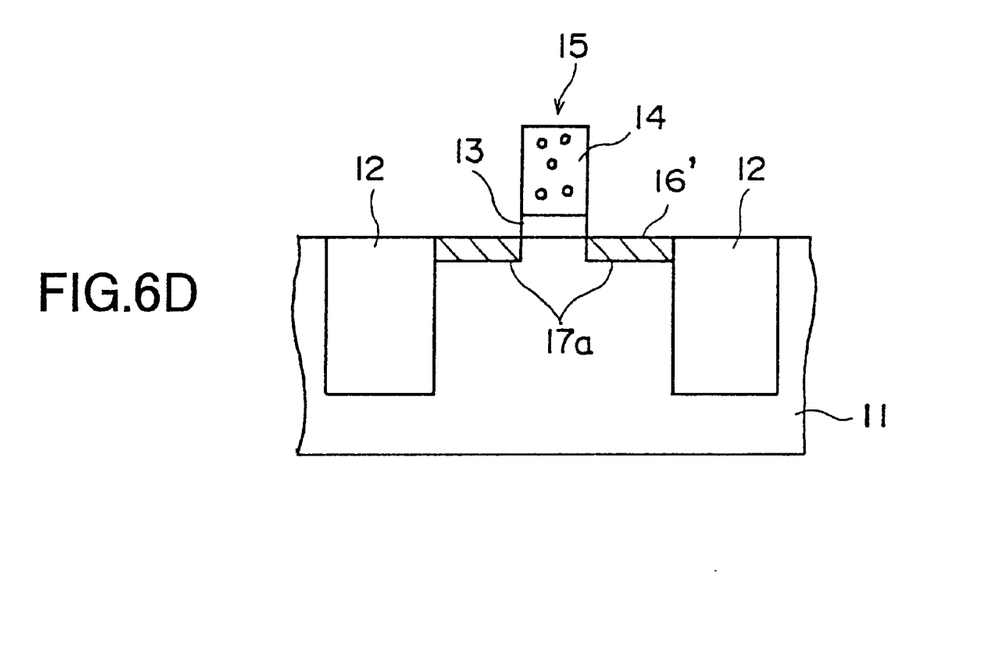

After the ion implantation process conducted in the step of FIG. 6C, the substrate is cleaned in the step of FIG. 6D by conducting an SC-1 cleaning process in a solution of $NH_4OH$ and $H_2O_2$, and the B contaminants on the surface of the substrate are removed. Further, by applying a rapid thermal annealing process or spike annealing process at 1050° C., the B ions introduced in the step of FIG. 6C are activated and a shallow diffusion region 17a of p-type is formed in the Si substrate 11 at both lateral sides of the gate structure 15.

Figure 6E:
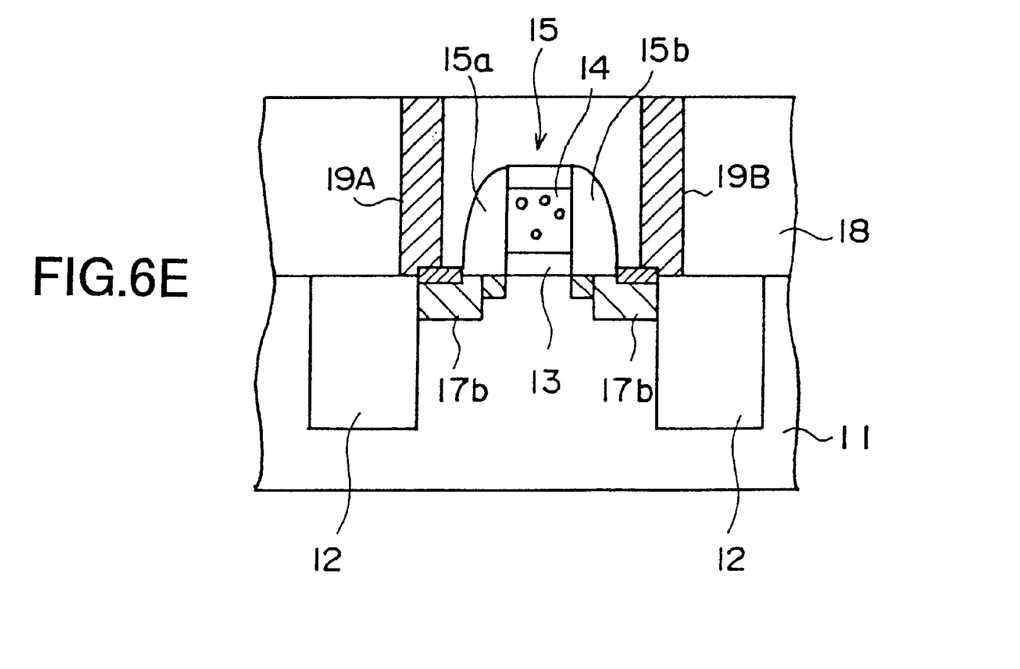

Further, in the step of FIG. 6E, side wall insulation films 15a and 15b are provided at both lateral sides of the gate structure 15, and p-type diffusion regions 17b of higher B concentration level are formed in the substrate 11 in correspondence to outer sides of the side wall insulation films 15a and 15b by conducting an ion implantation process of $B^+$ under a conduction normally used in the ion implantation process of $B^+$ while using the gate structure 15 and the side wall insulation films 15a and 15b as a mask. Thereby, the $p^+$-type diffusion regions 17b form, together with the shallow p-type diffusion regions 17a, an LDD structure, with the diffusion region 17a forming a so-called drain extension region.

After the formation of the LDD structure, an interlayer insulation film 18 is deposited on the substrate 11 so as to bury the gate structure 15, and contact holes are formed in the interlayer insulation film 18 so as to expose the foregoing diffusion regions 17b at both lateral sides of the gate structure 15. In the structure of FIG. 6D, the contact holes are filled with W plugs 19A and 19B, wherein it can be seen that there is formed a self-aligned silicide region at the part where the W plug 19A or 19B makes a contact with the corresponding diffusion region 17b.

In the present invention, it should be noted that the drain extension region 17a shown in FIGS. 6D and 6E have, while being formed of doping of B having a characteristically large diffusion coefficient, a bottom edge at a shallow depth, a depth less than about 50 nm from the top surface of the Si substrate 11. See the depth profile represented by the curve (1) in FIG. 2. Thus, the MOS transistor having such a shallow drain extension region can suppress the short channel effect even in such a case in which the gate length is 0.15 µm or less.

In the present embodiment, it should be noted that the low energy ion implantation process may be conducted in the step of FIG. 6C after forming a chemical oxide film on the region 16' by reacting thereto a solution containing $H_2O_2$ such as HPM, SPM or APM. In this case, the chemical oxide film thus formed is subjected to an annealing process conducted in an $N_2$ atmosphere at a temperature of typically 700° C. as represented in the flowchart of FIG. 5 so as to reduce the number of the Si—O dangling bonds formed on the chemical oxide film surface. By conducting the annealing process of the chemical oxide film at a relatively low temperature of 700° C. or less, the diffusion of the impurity element introduced previously in the channel region is minimized.

In the step of FIG. 5, an ion implantation process of $B^+$ is conducted into the Si substrate 11 through the chemical oxide film, after the thermal annealing process of the chemical oxide film, under an acceleration energy of typically 0.5 keV and a dose of $2\times10^{15}cm^{-2}$. Further, an SC-2 cleaning process is applied to the chemical oxide film on the substrate 11 and a rapid, spike thermal annealing process is applied at the temperature of 1050° C. for a duration of substantially zero seconds.

Otherwise, the process is substantially identical with the process of FIG. 6E and further description will be omitted.

By conducting the process of FIG. 4 or 5 in the step of FIG. 7D, a depth profile of B similar to the one for the sample (1) of FIG. 2 or the sample (4) of FIG. 3 is obtained.

Further, the present invention is not limited to the embodiments described heretofore, but various variations and modifications may be made without departing from the scope of the invention.

What is claimed is:

1. A method of fabricating a semiconductor device, comprising the steps of:
    introducing an impurity element into a Si substrate by an ion implantation process with an energy set such that the depth of a junction formed in said Si substrate by said impurity element is less than about 50 nm; and
    annealing, after said step of ion implantation process, said substrate;
    wherein said method further includes a step of removing an oxide film, from at least a portion of a surface of said Si substrate where ions are implanted, immediately before said step of ion implantation process so that said ion implantation process is conducted in the absence of an oxide film in said portion of said substrate and a junction is formed in said substrate with a depth shallower than a depth of a junction formed in said substrate by conducting said ion implantation process through said oxide film under the same condition.

2. A method as claimed in claim 1, wherein said ion implantation process of said impurity element is conducted with an acceleration energy of 0.2–1.5 keV.

3. A method as claimed in claim 1, wherein said oxide film comprises a chemical oxide film of Si.

4. A method as claimed in claim 1, wherein said annealing step is conducted for substantially zero duration time.

5. A method as claimed in claim 1, wherein said annealing step is conducted at a temperature of 1050° C. or higher.

6. A method of fabricating a semiconductor device, comprising the steps of:

forming a chemical oxide film on a surface of a Si substrate by a wet treatment using an acid;

annealing said Si substrate so as to reduce the number of Si—O dangling bonds existing on a surface of said chemical oxide film;

introducing an impurity element into said Si substrate through said chemical oxide film under an acceleration energy set such that the depth of a junction formed in said Si substrate by said impurity element is less than about 50 nm; and annealing said Si substrate thus introduced with said impurity element for activating said impurity element in said Si substrate.

7. A method as claimed in claim 6, wherein said step of reducing the number of Si—O dangling bonds includes a step of annealing said chemical oxide film.

8. A method as claimed in claim 7, wherein said annealing step for reducing the number of Si—O bonds is conducted in an inert atmosphere.

9. A method as claimed in claim 6, wherein said annealing step for activating said impurity element is conducted for substantially zero duration time.

10. A method as claimed in claim 6, wherein said annealing step for activating said impurity element is conducted at a temperature of 1050° C.

* * * * *